US011758672B2

(12) United States Patent
Morino

(10) Patent No.: US 11,758,672 B2
(45) Date of Patent: Sep. 12, 2023

(54) ELECTRONIC APPARATUS

(71) Applicant: Lenovo (Singapore) Pte. Ltd., Singapore (SG)

(72) Inventor: Takayuki Morino, Kanagawa (JP)

(73) Assignee: Lenovo (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 17/694,963

(22) Filed: Mar. 15, 2022

(65) Prior Publication Data
US 2022/0338362 A1    Oct. 20, 2022

(30) Foreign Application Priority Data
Apr. 20, 2021    (JP) .................. 2021-071168

(51) Int. Cl.
*H05K 5/00*    (2006.01)
*H05K 5/02*    (2006.01)
(52) U.S. Cl.
CPC ......... *H05K 5/0226* (2013.01); *H05K 5/0017* (2013.01)
(58) Field of Classification Search
None
See application file for complete search history.

(56) References Cited

U.S. PATENT DOCUMENTS

| 10,401,926 | B1* | 9/2019 | North ................... G06F 1/1618 |
| 10,901,468 | B2* | 1/2021 | Xia ...................... H04M 1/0218 |
| 2018/0324964 | A1 | 11/2018 | Yoo et al. |
| 2019/0041922 | A1* | 2/2019 | Kurma Raju ......... G06F 1/1637 |
| 2019/0354148 | A1* | 11/2019 | Delano ................. G06F 1/203 |

FOREIGN PATENT DOCUMENTS

| JP | 2001-142569 A | 5/2001 |
| JP | 2003-158355 A | 5/2003 |
| JP | 6636125 B1 | 1/2020 |

* cited by examiner

*Primary Examiner* — Anthony Q Edwards
*Assistant Examiner* — Rashen E Morrison
(74) *Attorney, Agent, or Firm* — Osha Bergman Watanabe & Burton LLP

(57) ABSTRACT

An electronic apparatus includes: a first chassis accommodating a first electronic component; a second chassis accommodating a second electronic component; a hinge connecting the first chassis and the second chassis in a relatively rotatable manner; and a flexible board connecting the first electronic component and the second electronic component. The flexible board includes a first folded portion that is offset from adjacent ends of the first and second chassis in the direction toward the first chassis, the first folded portion being folded from a first direction, which is directed from the second chassis to the first chassis, to a second direction that is opposite to the first direction.

9 Claims, 10 Drawing Sheets

ELECTRONIC APPARATUS

CROSS-REFERENCE TO RELATED APPLICATION

This application claims priority to Japanese Patent Application No. 2021-71168, filed on Apr. 20, 2021, the entire content of which is herein incorporated by reference.

TECHNICAL FIELD

The present disclosure relates to an electronic apparatus including a plurality of chassis that are relatively rotatably connected.

BACKGROUND

An electronic apparatus including a flexible display such as an organic electro luminescence (EL) may be configured so that not only the chassis but also the display is foldable.

SUMMARY

An electronic apparatus according to the first aspect of the present disclosure includes: a first chassis accommodating a first electronic component; a second chassis adjacent to the first chassis, the second chassis accommodating a second electronic component; a hinge that connects the first chassis and the second chassis in a relatively rotatable manner between a first posture where the first chassis and the second chassis are stacked to be overlaid in their surface normal directions and a second posture where the first chassis and the second chassis are placed side by side in the direction perpendicular to the surface normal directions; and a flexible board extending over the first chassis and the second chassis to be located across adjacent ends of the first chassis and the second chassis, the flexible board connecting the first electronic component and the second electronic component, the flexible board including a first folded portion that is offset from the adjacent ends in the direction toward the first chassis, the first folded portion being folded from a first direction, which is directed from the second chassis to the first chassis, to a second direction that is opposite to the first direction.

An electronic apparatus according to the second aspect of the present disclosure includes: a first chassis accommodating a first electronic component; a second chassis adjacent to the first chassis, the second chassis accommodating a second electronic component; a hinge that connects the first chassis and the second chassis in a relatively rotatable manner between a first posture where the first chassis and the second chassis are stacked to be overlaid in their surface normal directions and a second posture where the first chassis and the second chassis are placed side by side in the direction perpendicular to the surface normal directions; and a flexible board extending over the first chassis and the second chassis to be located across adjacent ends of the first chassis and the second chassis, the flexible board connecting the first electronic component and the second electronic component, the flexible board including: a first folded portion that is offset from the adjacent ends in the direction toward the first chassis, the first folded portion being folded from a first direction, which is directed from the second chassis to the first chassis, to a second direction that is opposite to the first direction; and a chassis fixing portion following the first folded portion folded to the second direction, the first-chassis fixing portion being relatively fixed to the first chassis.

DETAILED DESCRIPTION

Figure 1:
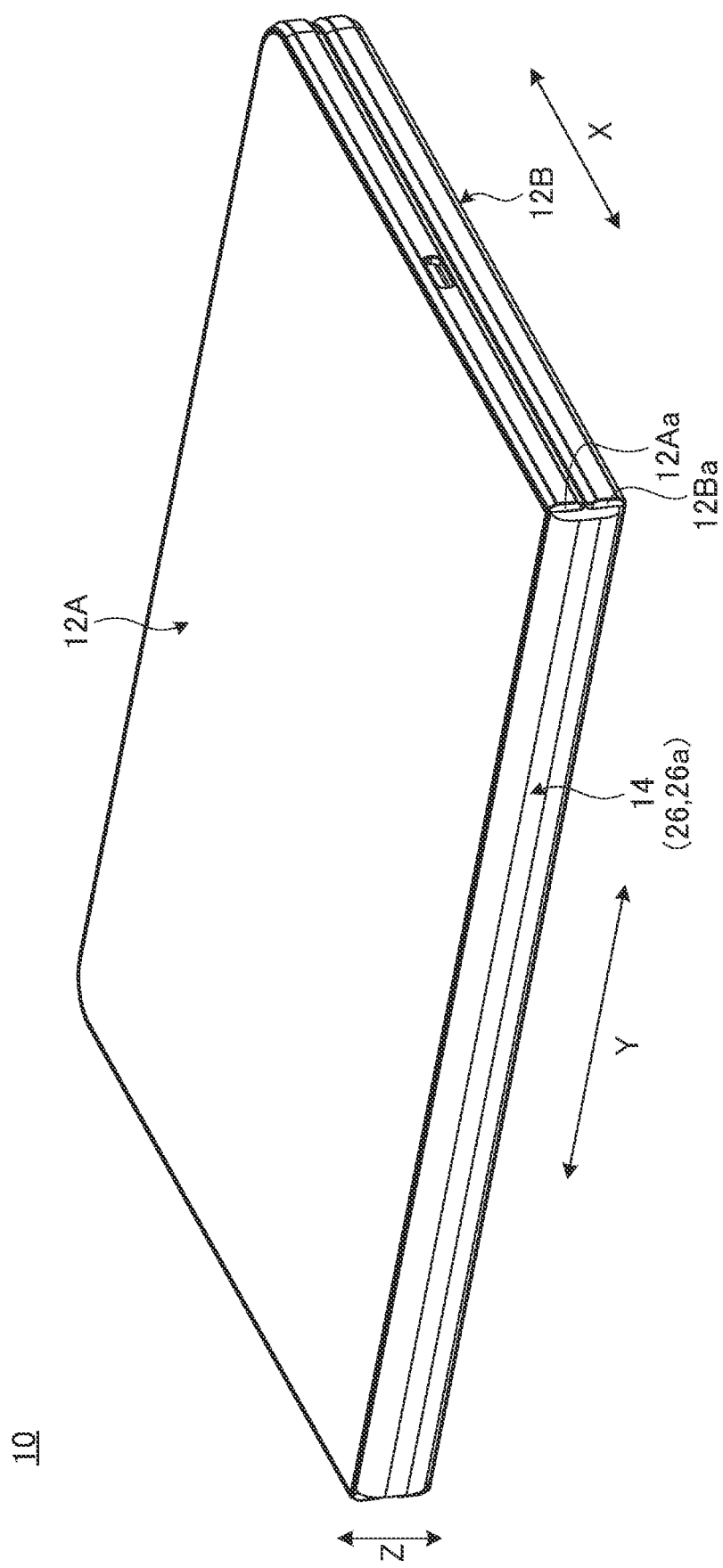
FIG. 1 is a perspective view of an electronic apparatus according to one embodiment that is closed to the 0-degree posture.

Referring to the drawings, the following describes an electronic apparatus according to the present disclosure in details by way of preferable embodiments.

Figure 2:
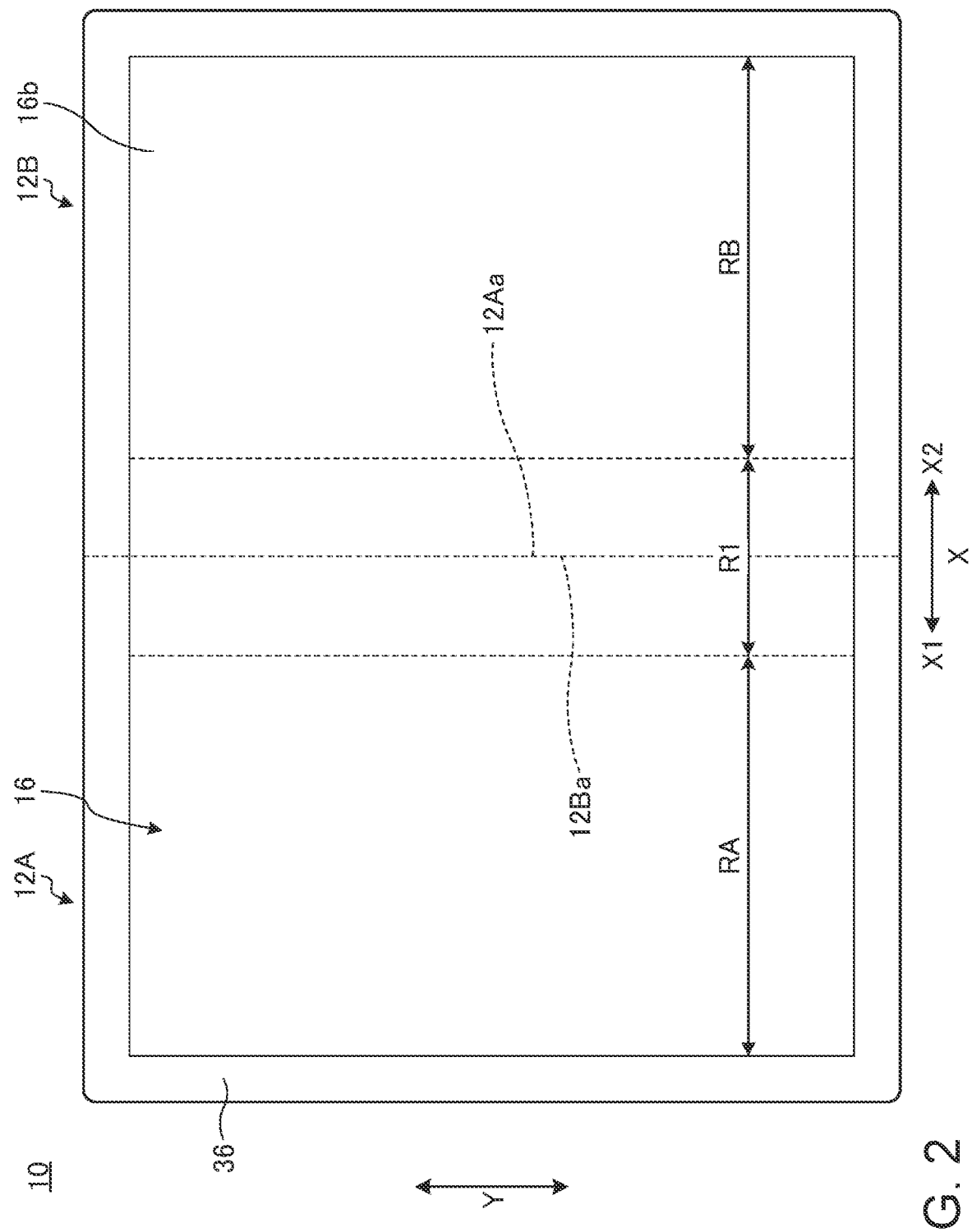
FIG. 2 is a plan view schematically illustrating the electronic apparatus of FIG. 1 that is opened to the 180-degree posture.
Figure 3:
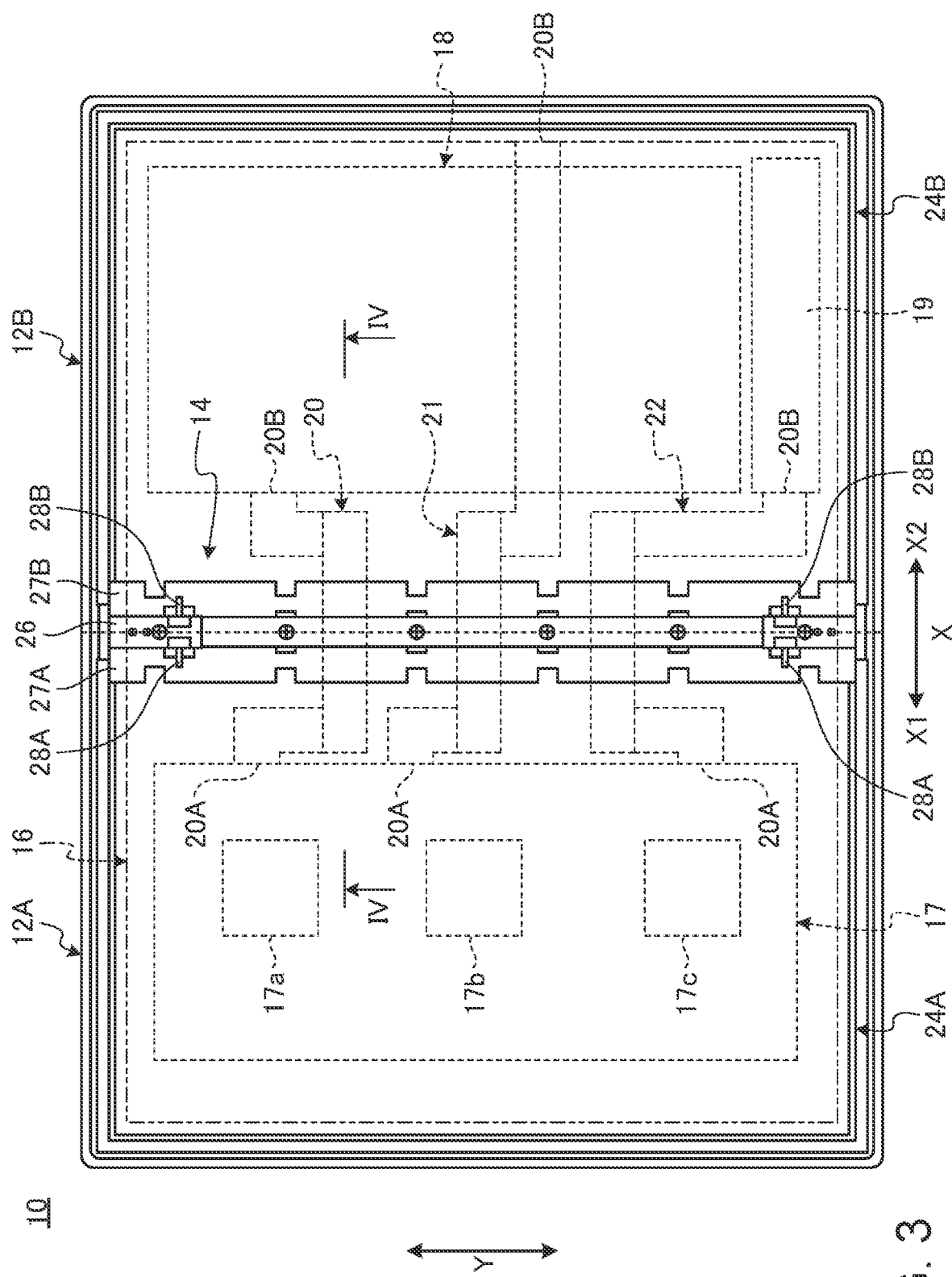
FIG. 3 is a plan view schematically illustrating the internal structure of the electronic apparatus of FIG. 2.

FIG. 1 is a perspective view of an electronic apparatus 10 according to one embodiment when the electronic apparatus 10 is closed to have a 0-degree posture. FIG. 2 is a plan view schematically illustrating the electronic apparatus 10 of FIG. 1 that is opened to a 180-degree posture. FIG. 3 is a plan view schematically illustrating the internal structure of the electronic apparatus 10 of FIG. 2.

As illustrated in FIGS. 1 to 3, the electronic apparatus 10 includes a first chassis 12A, a second chassis 12B, a hinge device 14, and a display 16. The electronic apparatus 10 of the present embodiment is described by way of an example of a tablet PC or a laptop PC that is foldable like a book. The electronic apparatus 10 may be other devices such as a mobile phone, a smartphone, and a portable game machine.

The chassis 12A and 12B are placed adjacent to each other. Each chassis 12A, 12B is a rectangular plate member having side walls standing on the three sides other than at the side (of the adjacent ends 12Aa and 12Ba) connected with the hinge device 14. In one example, the chassis 12A and 12B are metal plates made of such as stainless steel, magnesium, and aluminum or fiber reinforced resin plates containing reinforced fibers, such as carbon fibers. The hinge device 14 connects the chassis 12A and 12B in a relatively rotatable manner. The hinge device 14 also functions as a spine member that hides the gap between the adjacent ends 12Aa, 12Ba that is formed in the 0-degree posture illustrated in FIG. 1. The display 16 extends over the chassis 12A and 12B.

As illustrated in FIG. 3, the first chassis 12A accommodates electronic components such as a motherboard 17. In one example, electronic components such as a central processing unit (CPU) 17a, a communication module 17b, and a solid state drive (SSD) 17c are mounted on the motherboard 17. The CPU 17a performs calculations related to the main control and processing of the electronic apparatus 10. In one example, the communication module 17b is a device that processes information for wireless communication that is exchanged via an antenna mounted on the second chassis 12B, and supports a wireless WAN and a fifth generation mobile communication system, for example. The SSD 17c is a storage device that includes a semiconductor memory.

The second chassis 12B accommodates electronic components such as a battery device 18 and a subcard 19. The battery device 18 is a secondary cell that is a power source of the electronic apparatus 10. The subcard 19 is a board that mounts a power button and an external connector that conforms to the USB (Universal Serial Bus) standard, for example.

In one example, the chassis 12A and 12B are electrically connected with three flexible boards 20, 21 and 22. In one example, the flexible board 20 connects the motherboard 17 and the battery device 18. In one example, the flexible board 21 connects the motherboard 17 and the display 16. In one example, the flexible board 22 connects the motherboard 17 and the subcard 19. The flexible boards 20 to 22 may connect other devices. The number of flexible boards 20 to 22 installed can be changed as needed.

In another embodiment, the electronic apparatus 10 may be configured so that the second chassis 12B accommodates the motherboard 17 and the first chassis 12A accommodates the battery device 18 and other devices. The electronic apparatus 10 may have another arrangement of the electronic components, for example, the first chassis 12A accommodates the motherboard 17 and the subcard 19, and the second chassis 12B accommodates the battery device 18. The flexible boards 20(21, 22) may connect other devices.

For the electronic apparatus 10, the following refers to the direction of placing the chassis 12A and 12B side by side as X direction, the direction orthogonal to X direction and along the adjacent ends 12Aa and 12Ba as Y direction, and the thickness direction of the chassis 12A and 12B as Z direction. For X direction, the direction from the second chassis 12B to the first chassis 12A may be referred to as X1 direction, and the opposite direction from the first chassis 12A to the second chassis 12B may be referred to as X2 direction. For the angular posture between the chassis 12A and 12B, the following refers to the stacking state in which the chassis are overlaid in the surface normal direction as a 0-degree posture (see FIGS. 1 and 5C), and the state of placing the chassis side by side in the direction perpendicular to the surface normal direction (X direction) as a 180-degree posture (see FIG. 5A). The postures between 0 degree and 180 degrees are referred to with corresponding angles. For example, the posture illustrated in FIG. 5B is called a 60-degree posture. These angles are for convenience of explanation, and the actual product may have an angular position that deviates slightly from the exact angular position indicated by the angle. The present embodiment describes the angular posture including these deviated angular positions as a 0-degree posture, for example.

Figure 4:
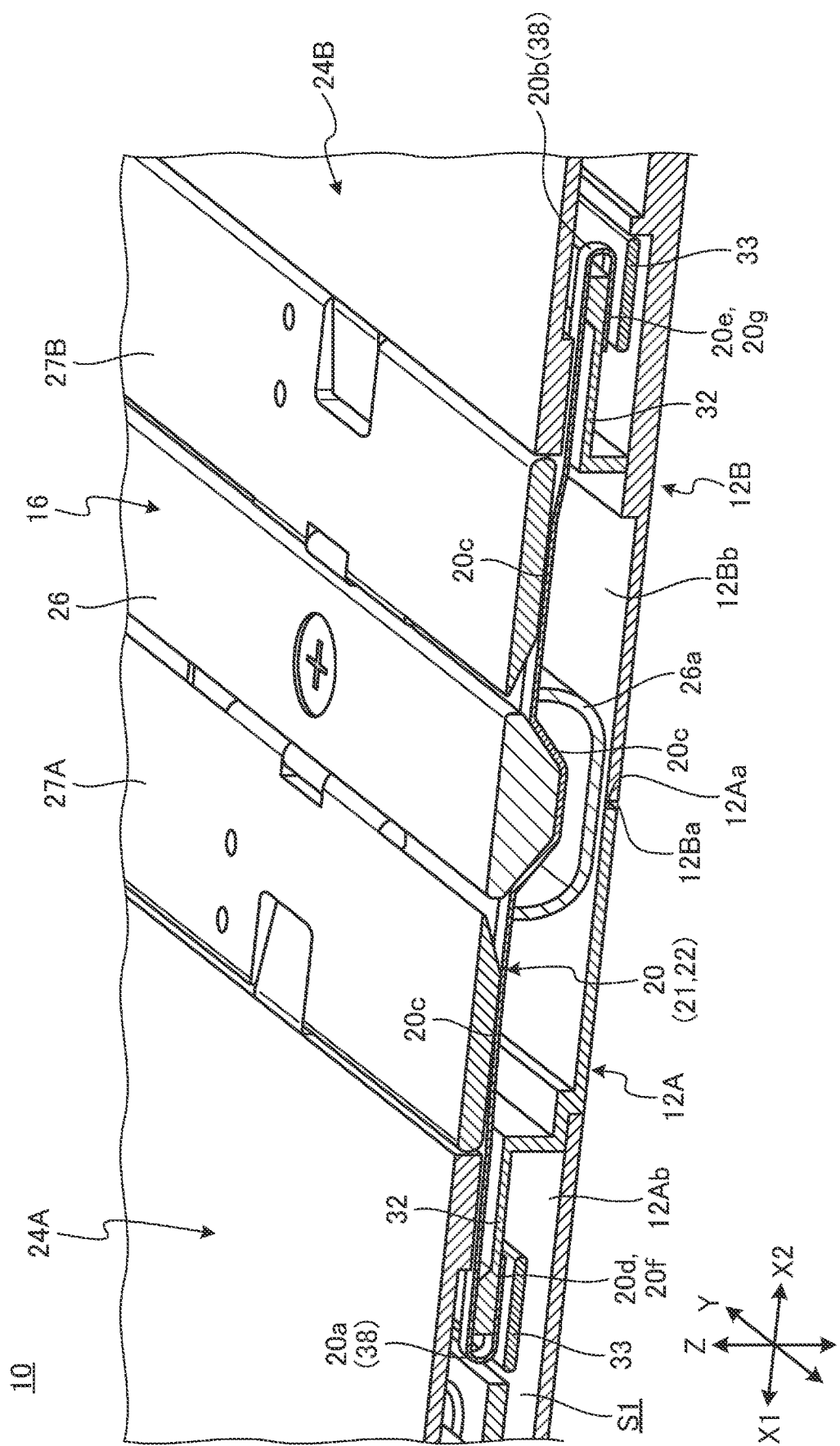
FIG. 4 is a schematic perspective cross-sectional view taken along the line IV-IV in FIG. 3.

FIG. 4 is a schematic perspective cross-sectional view taken along the line IV-IV in FIG. 3. FIG. 4 illustrates a representative example of the flexible board 20 and its periphery, and the other flexible boards 21, 22 and their periphery also have the same or similar configuration as illustrated in FIG. 4. In the following, like numerals for the other flexible boards 21 and 22 indicate like components of the flexible board 20, and their descriptions are omitted.

Figure 6A:
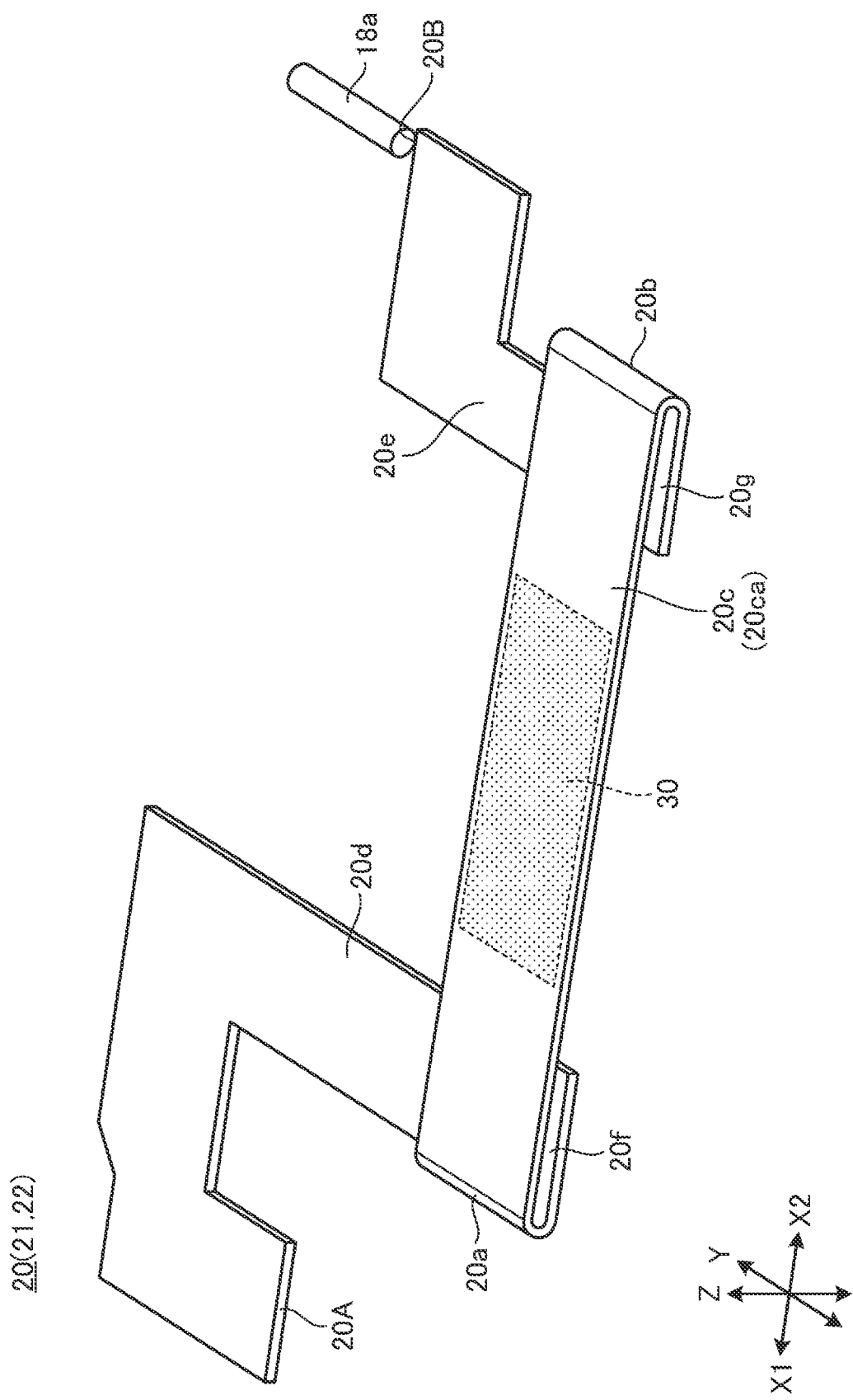
FIG. 6A is a schematic perspective view of a flexible board viewed from the surface of the display.
Figure 6B:
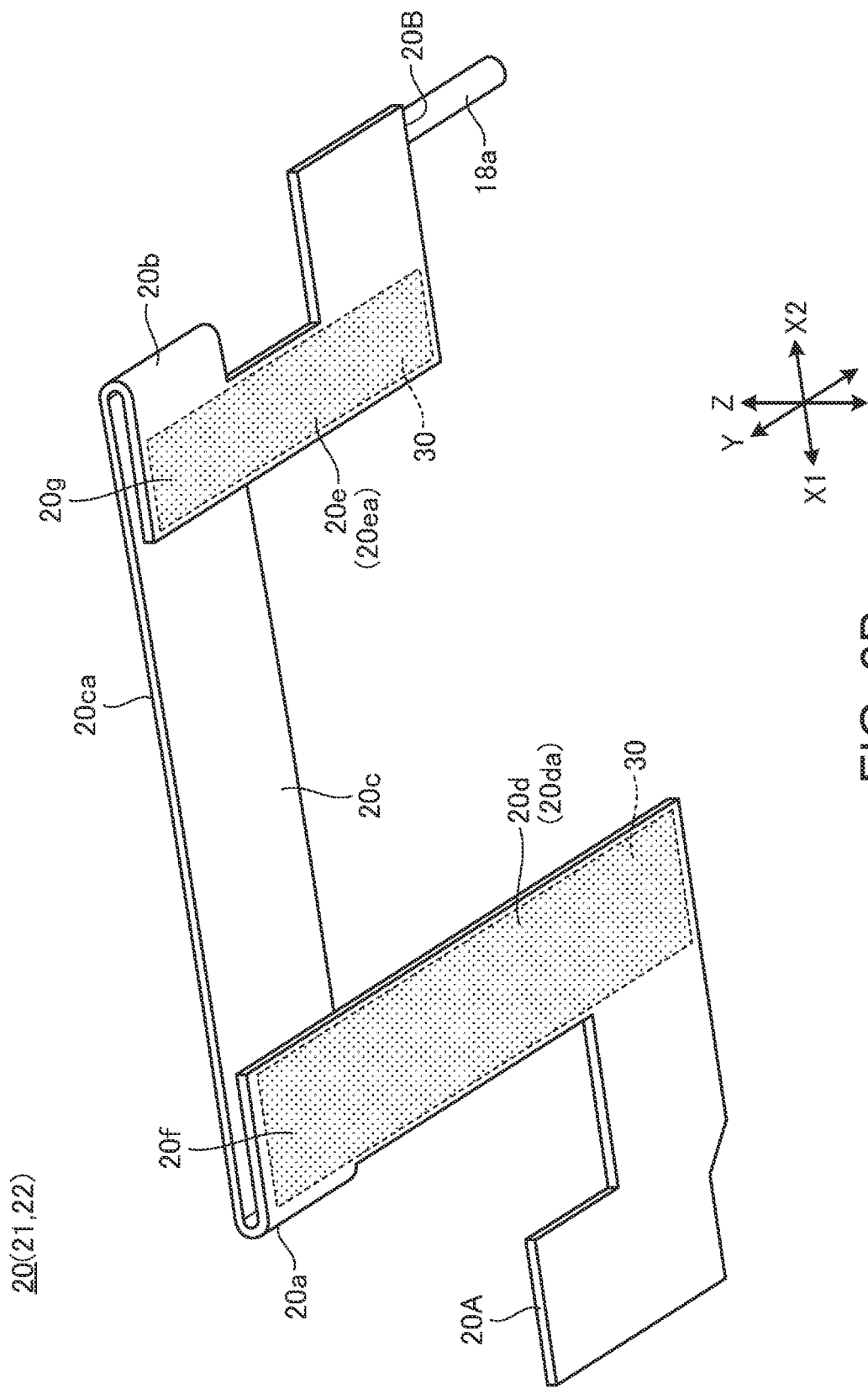
FIG. 6B is a schematic perspective view of the flexible board viewed from the rear face of the display.

In one example, the flexible boards 20 to 22 are flexible printed circuit (FPC) boards made of a flexible insulating film to be thin and soft. As illustrated in FIG. 3, the flexible board 20 (21, 22) has a first end 20A in the first chassis 12A, the first end 20A connecting to the motherboard 17, and has a second end 20B in the second chassis 12B, the second end 20B connecting to the battery device 18 (the display 16, and the subcard 19). FIGS. 6A and 6B illustrate the example where the second end 20B is connected to the battery device 18 via a cable 18a. In another example, the second end 20B may be connected directly to the battery device 18 (the display 16, and the subcard 19) without the cable 18a.

Figure 5A:
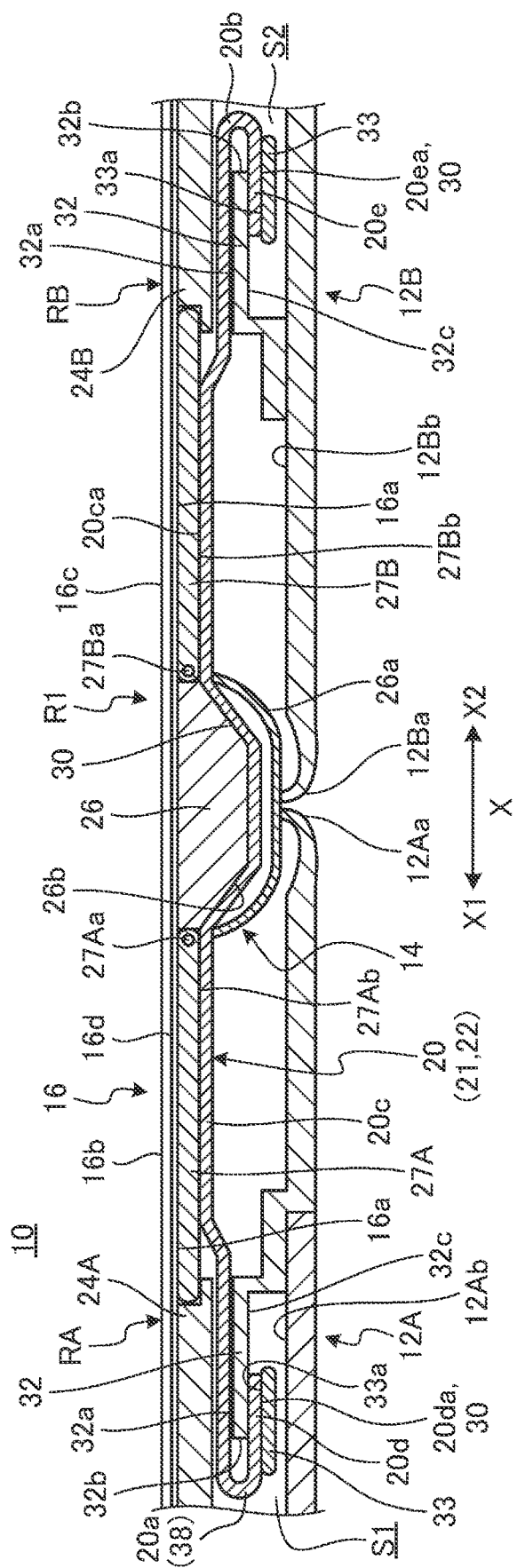
FIG. 5A is a schematic cross-sectional view of the electronic apparatus in the 180-degree posture.
Figure 5B:
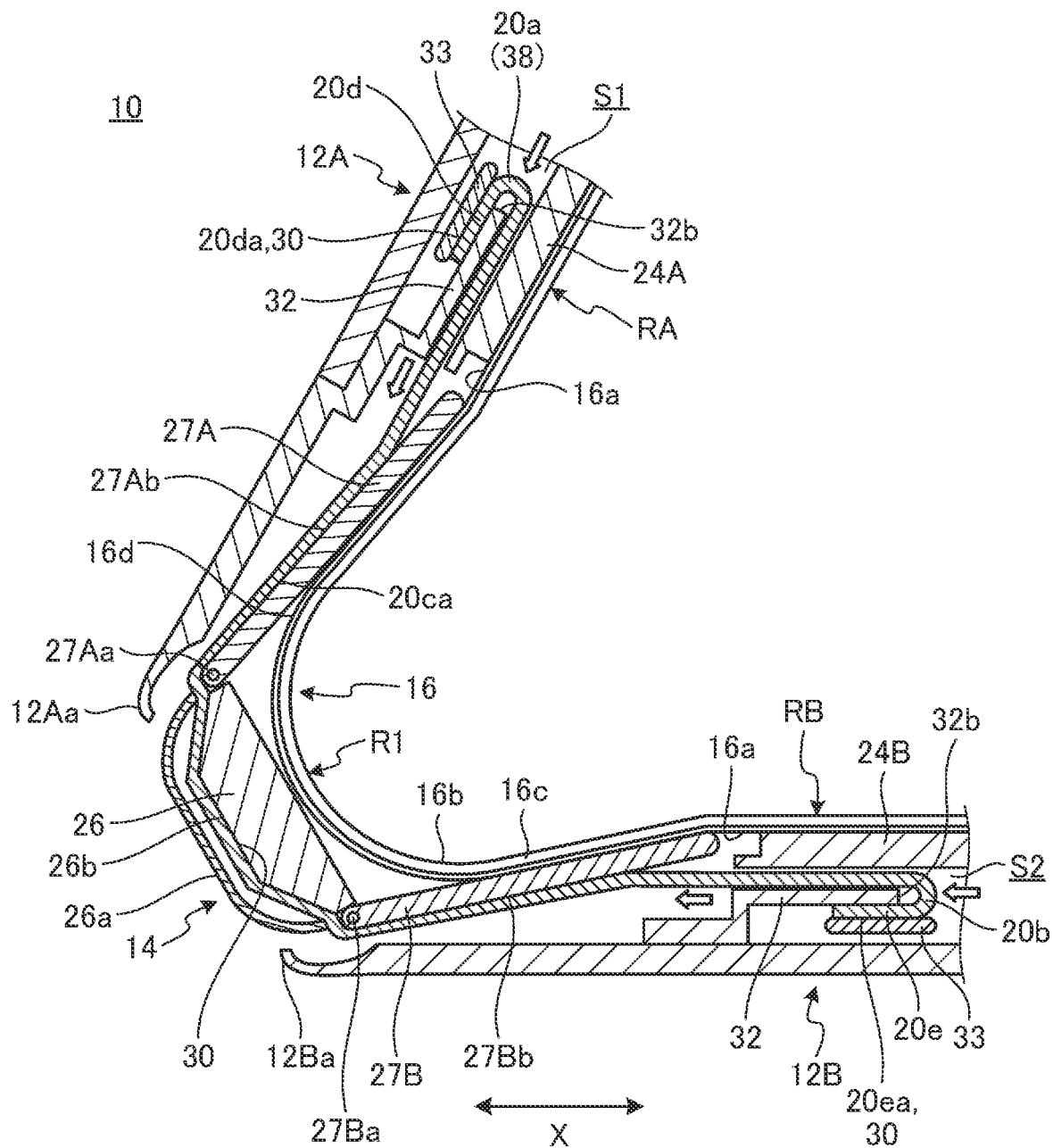
FIG. 5B is a schematic cross-sectional view of the electronic apparatus in the 60-degree posture.
Figure 5C:
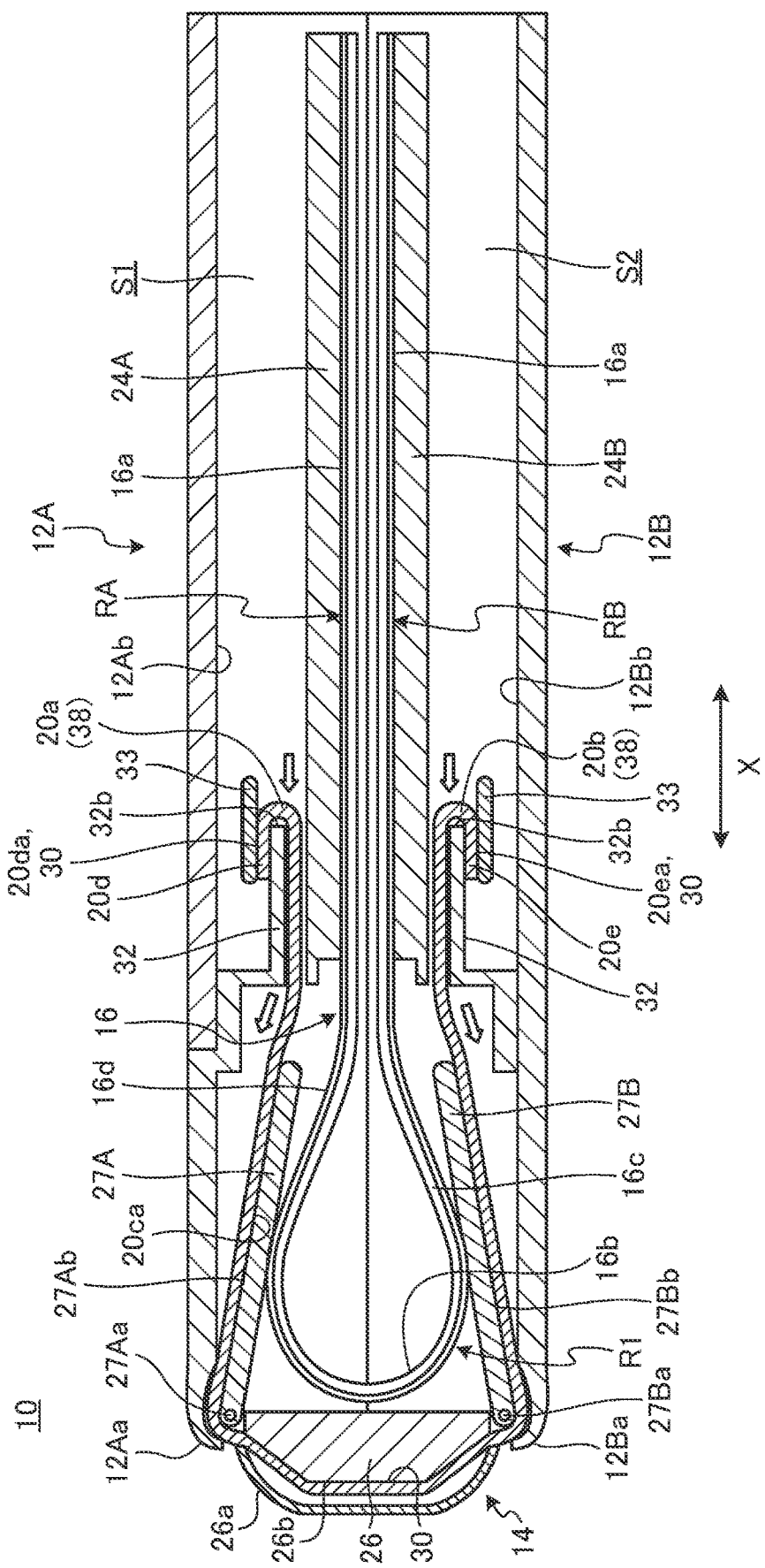
FIG. 5C is a schematic cross-sectional view of the electronic apparatus in the 0-degree posture.

FIGS. 5A, 5B, and 5C are schematic cross-sectional views of the electronic apparatus 10 in the 180-degree posture, the 60-degree posture, and the 0-degree posture, respectively.

As illustrated in FIGS. 5A to 5C, the chassis 12A and 12B are connected via the hinge device 14 to be relatively rotatable between two angular postures (between the 0-degree posture and the 180-degree posture in this embodiment). In the 0-degree posture illustrated in FIG. 5C, the chassis 12A and 12B are stacked to be overlaid in the surface normal direction. In the 180-degree posture illustrated in FIG. 5A, the chassis 12A and 12B are placed side by side in the direction (X direction) perpendicular to the surface normal direction.

The display 16 is a flexible display that extends over the chassis 12A and 12B, and has a region RA in the first chassis 12A and a region RB in the second chassis 12B. In the 0-degree posture illustrated in FIG. 5C, the region RA and the region RB of the display 16 are opposed to each other, and a bending region R1 that is the boundary region between the regions RA and RB is bent in an arc shape. In the 180-degree posture illustrated in FIG. 5A, the regions RA, RB and the bending region R1 of the display 16 are placed side by side on the XY plane to have a single flat plate shape as a whole (see also FIG. 2).

The display 16 has a rear face 16a supported by the chassis 12A and 12B and the hinge device 14, and has a surface 16b that displays an image. The display 16 is located at the top of the chassis 12A, 12B in Z direction. The display 16 has a structure of a sheet-like member 16d attached to the rear face of a display panel 16c including an organic EL, for example.

In the display 16, the region RA is relatively fixed to the first chassis 12A, and the region RB is relatively fixed to the second chassis 12B. Specifically, the rear face 16a of the region RA is supported by a first plate 24A and a first support plate 27A, and is fixed to the first chassis 12A via the first plate 24A. The rear face 16a of the region RB is supported by a second plate 24B and a second support plate 27B, and is fixed to the second chassis 12B via the second plate 24B. The support plates 27A and 27B are components of the hinge device 14.

The bending region R1 is movable relative to the chassis 12A and 12B. In the 180-degree posture, the rear face 16a of the bending region R1 is supported by a hinge body 26 and the support plates 27A and 27B (see FIG. 5A). In the 0-degree posture, the bending region R1 is bent like an arc. A part of the rear face 16a is supported by the support plates 27A and 27B, and most of the rear face 16a is separated from the hinge device 14 (see FIG. 5C).

The plates 24A and 24B are made of carbon-fiber reinforced resin or metal. The plates 24A and 24B are placed on the left and the right of the hinge device 14, and have surfaces that support the rear face 16a of the display 16.

As illustrated in FIGS. 3, 4 and 5A, the hinge device 14 of the present embodiment includes the hinge body 26, the first support plate 27A and the second support plate 27B. The hinge device 14 may have another structure as long as it connects the chassis 12A and 12B in a relatively rotatable manner and bends the display 16 in a desired bending shape.

The hinge body 26 is located across the adjacent ends 12Aa and 12Ba of the chassis 12A and 12B (see FIG. 5A), and extends along the adjacent ends 12Aa and 12Ba in Y direction over substantially the entire length (See FIGS. 1 and 3). The hinge body 26 is a block-like component made of metal such as aluminum. The hinge body 26 is connected to be movable relative to a bracket fixed to the first chassis 12A via a first rotation link 28A (see FIG. 3). The hinge body 26 also is connected to be movable relative to a bracket fixed to the second chassis 12B via a second rotation link 28B (see FIG. 3). This allows the hinge body 26 to connect the chassis 12A and 12B in a relatively rotatable manner. The hinge body 26 internally includes a gear mechanism that synchronizes the rotation motions between the chassis 12A and 12B, a torque mechanism that applies a predetermined rotational torque to the rotation motions between the chassis 12A and 12B, and the like. The outer surface of the hinge body 26 is covered with a decorative cover 26a.

In the 180-degree posture illustrated in FIG. 5A, the hinge body 26 is housed in the chassis 12A and 12B, and is located across the adjacent ends 12Aa and 12Ba, which are close to or in contact with each other, in X direction. In the 0-degree posture illustrated in FIG. 5C, the hinge body 26 is located to close the gap between the adjacent ends 12Aa and 12Ba that are largely separated from each other, and serves as the spine of the electronic apparatus 10 folded like a book. In this posture, the cover 26a exposed to the outermost surface prevents deterioration of the appearance design of the folded electronic apparatus 10 (see FIG. 1).

The support plates 27A and 27B are made of metal such as aluminum, and have a symmetrical shape. The first support plate 27A is placed to face the inner surface of the first chassis 12A and extends along the adjacent end 12Aa over substantially the entire length in Y direction. The first support plate 27A has one end in the width direction (X direction) that is connected to the hinge body 26 in a relatively rotatable manner via a rotation shaft 27Aa. The first support plate 27A has the other end in the width direction that is movable relative to the first chassis 12A, the other end being adjacent to one end of the first plate 24A. With this configuration, the first support plate 27A is placed between the hinge body 26 and the first plate 24A when the electronic apparatus has the 180-degree posture.

The second support plate 27B is placed to face the inner surface of the second chassis 12B and extends along the adjacent end 12Ba over substantially the entire length in Y direction. The second support plate 27B has one end that is connected to the hinge body 26 in a relatively rotatable manner via a rotation shaft 27Ba, and has the other end adjacent to one end of the second plate 24B. With this configuration, the second support plate 27B is placed between the hinge body 26 and the second plate 24B when the electronic apparatus has the 180-degree posture.

As the chassis 12A and 12B rotate, the support plates 27A and 27B move relative to the inner surfaces 12Ab and 12Bb of the chassis 12A and 12B in X and Z directions. In the 180-degree posture, the surfaces of the support plates 27A and 27B support the rear face 16a of the display 16. In angular postures other than 180 degrees, the support plates 27A and 27B are in contact with the display 16 while keeping a gap from the display 16 or applying a small force that does not deform the display 16. The support plates 27A, 27B may be configured to support the bending region R1 of the display 16 in angular postures other than 180 degrees to correct its shape. In this way, the support plates 27A, 27B stably support the bending region R1 of the display 16 with a plane when the electronic apparatus has the 180-degree posture, while not interfering with the bending motion of the bending region R1.

Next the following describes a specific configuration of the flexible board 20 (21, 22). FIG. 6A is a schematic perspective view of the flexible board 20 viewed from the surface of the display 16. FIG. 6B is a schematic perspective view of the flexible board 20 viewed from the rear face of the display 16.

As illustrated in FIGS. 4, 6A and 6B, the flexible board (21, 22) has a first folded portion 20a, a second folded portion 20b, a hinge fixing portion 20c, a first-chassis fixing portion 20d, a second-chassis fixing portion 20e, a first bending portion 20f, and a second bending portion 20g.

The first folded portion 20a is a portion of the flexible board 20 folded from X1 direction to X2 direction to have a substantially U-letter shape in a side view. The first folded portion 20a is offset toward the first chassis 12A (in X1 direction) from the adjacent ends 12Aa, 12Ba. Specifically, the first folded portion 20a is displaced in X1 direction from the first support plate 27A, and is located in space S1 between the rear face of the first plate 24A and the inner surface 12Ab of the first chassis 12A. The first folded portion 20a is folded from X1 direction to X2 direction while gradually separating away from the rear face 16a of the display 16 in Z direction. In other words, the first folded portion 20a is folded from top to bottom in the direction from the second end 20B to the first end 20A of the flexible board 20.

The second folded portion 20b is basically symmetrical to the first folded portion 20a. That is, the second folded portion 20b is displaced in X2 direction from the adjacent ends 12Aa and 12Ba, and is located in space S2 between the second plate 24B and the inner surface 12Bb of the second chassis 12B. The second folded portion 20b is folded from top to bottom in the direction from direction X2 direction to X1 direction.

The hinge fixing portion 20c is located between the folded portions 20a and 20b. The hinge fixing portion 20c extends across the hinge device 14 and the adjacent ends 12Aa and 12Ba in X direction. The hinge fixing portion 20c extends from the rear face 27Ab of the first support plate 27A through the rear face 26b of the hinge body 26 to the rear face 27Bb of the second support plate 27B. As illustrated in FIG. 6A, the hinge fixing portion 20c has a surface 20ca, on which an adhesive member 30 is provided. The adhesive member 30 is double-sided tape, an adhesive, or the like. The hinge fixing portion 20c is fixed to the hinge device 14 via the adhesive member 30.

The first-chassis fixing portion 20d is a portion following the first folded portion 20a folded from X1 direction to X2 direction. The flexible board 20 of the present embodiment bends at the first bending portion 20f from X direction to Y direction between the first folded portion 20a and the motherboard 17. The first-chassis fixing portion 20d extends in Y direction from the first bending portion 20f. As illustrated in FIG. 6B, the first-chassis fixing portion 20d has a rear face 20da, on which another adhesive member 30 is provided. The first-chassis fixing portion 20d is relatively fixed to the first chassis 12A via the adhesive member 30.

The second-chassis fixing portion 20e is basically symmetrical to the first-chassis fixing portion 20d. That is, the second-chassis fixing portion 20e follows the second folded portion 20b folded from X2 direction to X1 direction and extends from the second bending portion 20g that bends from X direction to Y direction. As illustrated in FIG. 6B, the second-chassis fixing portion 20e also is relatively fixed to the second chassis 12B via the adhesive member 30 on its rear face 20ea.

The first bending portion 20f is a portion following the first folded portion 20a folded from X1 direction to X2 direction, where the flexible board 20 bends from X direction to Y direction. The flexible board 20 (21, 22) is folded at the first folded portion 20a from X1 direction toward the motherboard 17 to the opposite X2 direction. The first bending portion 20f is a portion for turning the flexible board 20 (21, 22) again toward the motherboard 17 after the flexible board is folded in X2 direction at the first folded portion 20a. In the configuration example illustrated in FIG. 6A, the flexible board bends in Y direction at the first bending portion 20f, and bends in X1 direction and then in Y direction to lead to the first end 20A, which is to be connected to the motherboard 17. In another example, the flexible board 20 (21, 22) may have the first end 20A immediately after bending at the first bending portion 20f in Y direction, or immediately after the subsequent bending in X1 direction.

The second bending portion 20g is basically symmetrical to the first bending portion 20f. That is, the second bending portion 20g is a portion following the second folded portion 20b folded from X2 direction to X1 direction, where the flexible board 20 bends from X direction to Y direction. The second bending portion 20g is a portion for turning the flexible board 20 (21, 22) again toward the battery device 18 or the like. In the configuration example illustrated in FIG. 6A, the flexible board bends in Y direction at the second bending portion 20g, and bends in X1 direction to lead to the second end 20B, which is to be connected to the battery device 18 or the like. The location of the second end 20B also can be changed as appropriate.

As illustrated in FIG. 3, the flexible boards 21 and 22 are different from the flexible board 20 in total length and the bending direction at the bending portions 20f and 20g, but may share their basic structures.

Next, the following describes the structure of mounting the flexible board 20 (21, 22) to the chassis 12A and 12B.

As illustrated in FIGS. 4 and 5A, the first chassis 12A of the present embodiment includes a rising piece 32 and a support bar 33. The rising piece 32 is a plate piece that extends from the inner surface 12Ab in X1 direction while rising like a staircase. The rising piece 32 extends in Y direction in space S1. The support bar 33 is a plate that is fixed to the inner surface 12Ab by screwing, for example, and is narrow in X direction and thin in Z direction. The support bar 33 extends in Y direction in space S1 to be parallel to the horizontal distal end portion of the rising piece 32 with a space therebetween. The second chassis 12B also includes these rising piece 32 and support bar 33. In this embodiment, the rising piece 32 and the support bar 33 of the second chassis 12B have substantially a symmetrical structure with those of the first chassis 12A, but the structure is somewhat different.

First, as illustrated in FIGS. 4 and 5A, the hinge fixing portion 20c of the flexible board 20 (21, 22) is fixed to the rear face 26b of the hinge body 26 and the rear faces 27Ab, 27Bb of the support plates 27A, 27B with their adhesive members 30. The hinge fixing portion 20c may be fixed to only a part of the hinge body 26 and support plates 27a, 27b, or may be fixed with screws or hooks.

Next, the portion of the flexible board 20 (21, 22) located in the first housing 12A outside the hinge fixing portion 20c extends from the rear face 27Ab of the first support plate 27A to the first folded portion 20a while passing through between the rear face of the first plate 24A and the surface 32a of the rising piece 32. This part is free to move and is not fixed to the first plate 24A or the rising piece 32.

At the first folded portion 20a, the flexible board 20 (21, 22) is folded from X1 direction to X2 direction and from top to bottom while keeping the free movable state. The first folded portion 20a has a U-letter shape in side view and surrounds the rising piece 32 around the outer end face 32b. The first bending portion 20f and the first-chassis fixing portion 20d following the folding at the first folded portion 20a in X2 direction then are located between the rear face 32c of the rising piece 32 and the surface 33a of the support bar 33. The rear face 20da of the first-chassis fixing portion 20d is fixed to the surface 33a of the support bar 33 via the adhesive member 30.

Next, the portion of the flexible board 20 (21, 22) located in the second housing 12B outside the hinge fixing portion 20c extends from the rear face 27Bb of the second support plate 27B to the second folded portion 20b while passing through between the rear face of the second plate 24B and the surface 32a of the rising piece 32. This part also is free to move and is not fixed to the second plate 24B or the rising piece 32.

At the second folded portion 20b, the flexible board 20 (21, 22) is folded from X2 direction to X1 direction and from top to bottom while keeping the free movable state. The second bending portion 20g and the second-chassis fixing portion 20e following the folding at the second folded portion 20b in X1 direction then are located between the rear face 32c of the rising piece 32 and the surface 33a of the support bar 33. The rear face 20ea of the second-chassis fixing portion 20e is fixed to the surface 33a of the support bar 33 via the adhesive member 30.

As such, the flexible board 20 (21, 22) is configured so that the hinge fixing portion 20c is fixed to the hinge device 14, the first-chassis fixing portion 20d is relatively fixed to the first chassis 12A, and the first folded portion 20a and its periphery between these portions are freely movable. Then, the flexible board 20 (21, 22) is configured so that the hinge fixing portion 20c is fixed to the hinge device 14, the second-chassis fixing portion 20e is relatively fixed to the second chassis 12B, and the second folded portion 20b and its periphery between these portions are freely movable.

Next, the following describes the rotation motion of the chassis 12A and 12B and the motion of the flexible board 20 (21, 22) during the rotation motion.

In the 180-degree posture illustrated in FIG. 5A, the plates 24A and 24B, the hinge body 26, and the support plates 27A and 27B are placed on the same XY plane so that their surfaces are flush and define a flat plate as a whole. The entire rear face 16a of the display 16 is supported on this flat plate to be a single flat large screen (see also FIG. 2). In FIG. 2, reference numeral 36 denotes a bezel member, which is a frame-like cover covering an inactive region at the periphery of the surface 16b of the display 16. Thus, in the 180-degree posture, the electronic apparatus 10 functions as a tablet PC with a large screen.

Next, the following describes the rotation motion of the chassis 12A and 12B from the 180-degree posture to the 0-degree posture. In this case, as the chassis 12A and 12B are opened, the support plates 27A and 27B move relative to the chassis 12A and 12B while swinging around their rotary shafts 27Aa and 27Ba (see FIGS. 5A to 5C). The chassis 12A and 12B move relative to each other in the directions (X1 and X2 directions) away from the support plates 27A and 27B, respectively. In this motion, the plates 24A and 24B move together with the chassis 12A and 12B. This means that the display 16 fixed to the plates 24A and 24B are gradually opened at the bending region R1.

In the 0-degree posture illustrated in FIG. 5C, the chassis 12A and 12B are stacked so that their surface normal directions are substantially parallel to each other, and have a folded state being excellent in design. At this time, the display 16 has a bell shape having the bending region R1 curved with a desired curvature. That is, the display 16 has the bending region R1 that is bent into a desired bell shape by the plates 24A and 24B that are stacked in parallel having a predetermined gap therebetween. As a result, the chassis 12A and 12B of the electronic apparatus 10 can be made as thin as possible. This also suppresses a breakage of the display 16 during bending.

Note that, during such a rotation motion, the display 16 has to keep the length unchanged. This is because the display 16 may break or cause a problem if it receives an expansion/contraction load. Therefore, the electronic apparatus 10 is configured so that the center of rotation between the chassis 12A and 12B coincides with the surface 16b of the display 16 to suppress the expansion/contraction load on the display 16 during bending.

Meanwhile, the flexible board 20 (21, 22) is located below the display 16 and outside the center of rotation, and thus undergoes expansion and contraction. That is, when the electronic apparatus changes from 180 degrees to 0 degree in posture, the flexible board 20 (21, 22) receives a tensile force. When the electronic apparatus changes from 0 degree to 180 degree in posture, the flexible board 20 (21, 22) receives a compressive force. The flexible board 20 (21, 22) of the present embodiment is configured to deal with this expansion/contraction with their folded portions 20a and 20b.

Figure 7:
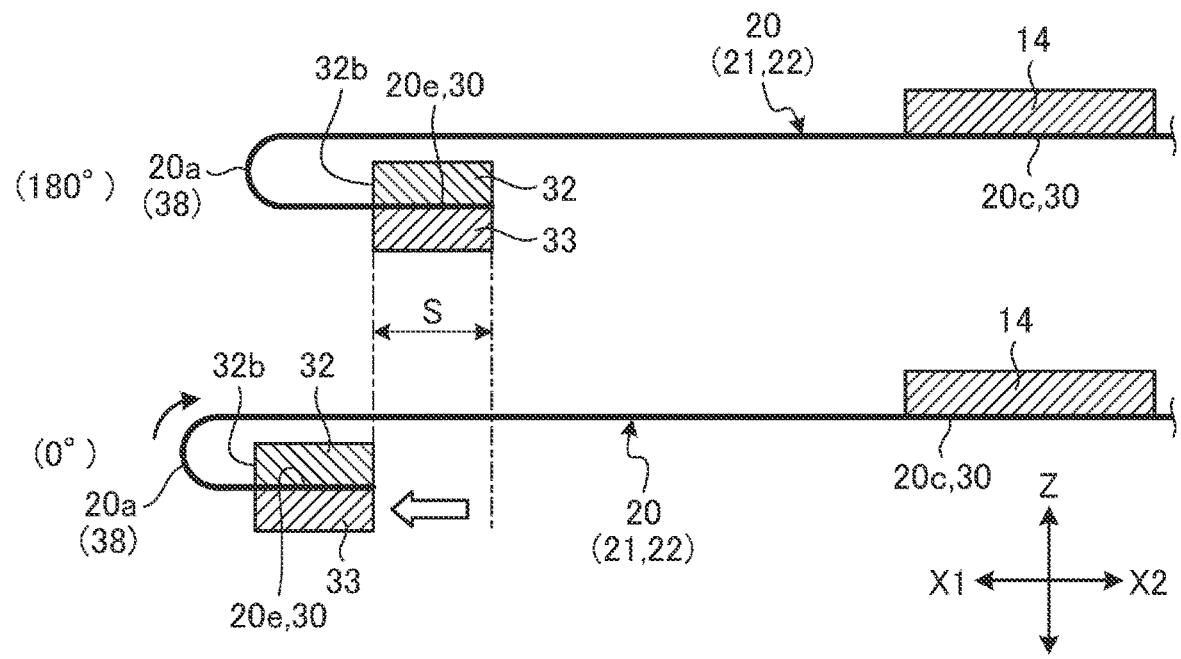
FIG. 7 is schematic side views of a first folded portion and its periphery in the 180-degree posture and the 0-degree posture.

FIG. 7 is schematic side views of the first folded portion 20a and its periphery in the 180-degree posture (180°) and the 0-degree posture (0°).

As illustrated in FIGS. 5A and 7, in the 180-degree posture, the first folded portion 20a has an extra length portion 38 that is largely separated in X1 direction from the outer end face 32b of the rising piece 32. The first folded portion 20a is freely movable between the hinge fixing portion 20c and the first-chassis fixing portion 20d. When rotating from the 180-degree posture to the 0-degree posture, the first chassis 12A moves relative to the hinge device 14 so that it separates from the hinge device 14 in X1 direction. Therefore, when rotating from the 180-degree posture to the 0-degree posture, the extra length portion 38 is gradually fed in X2 direction between the hinge fixing portion 20c and the first-chassis fixing portion 20d. As a result, the extra length portion 38 is shortened in the 0-degree posture, so that the first folded portion 20a is close to the outer end face 32b of the rising piece 32.

When rotating from the 0-degree posture to the 180-degree posture, the first chassis 12A moves relative to the hinge device 14 in X2 direction so that it approaches the hinge device 14. Therefore, when rotating from the 0-degree posture to the 180-degree posture, the extra length portion 38 is gradually fed in X1 direction between the hinge fixing portion 20c and the first-chassis fixing portion 20d. As a result, the extra length portion 38 is lengthened in the 180-degree posture, so that the first folded portion 20a is away from the outer end face 32b of the rising piece 32.

A stroke S illustrated in FIG. 7 is the movement stroke of the flexible board 20 (21, 22) with the first folded portion 20a, which may be about 4 mm, for example. The second folded portion 20b moves in the same manner as that of the first folded portion 20a described above other than that their motions are symmetric, and their detailed descriptions are omitted.

As described above, in the electronic apparatus 10 of this embodiment, the flexible board 20 (21, 22) has the folded portion 20a, 20b. This configuration smoothly deals with the extra length (extra length portion 38) generated by expansion and contraction of the flexible board 20 (21, 22) during the rotation motion between the chassis 12A and 12B. In addition, the folded portions 20a and 20b in the direction (X direction) of placing the chassis 12A and 12B deal with the extra length of the flexible board 20 (21, 22), which easily achieves the reproducibility of the extra length portion 38 in shape.

Now, consider a configuration that does not have the folded portions 20a and 20b. This configuration fails to manage the extra length of the flexible board. Therefore, the flexible board with this configuration may form a wave shape, a bent shape, or other shapes in the gap between the chassis when the electronic apparatus has the 180-degree posture. This causes a concern that the flexible board forms a different shape for each rotation motion. As a result, the flexible board with this configuration may receive a large load during the expansion and contraction, and the thickness of the chassis may have to increase to deal with the extra length of the flexible board. This configuration has another concern that the extra length part of the flexible board in the 180-degree posture moves randomly to get caught on other members or components inside the chassis and interferes with the rotation motion of the flexible board toward the 0-degree posture, or the connector of the flexible board may come off.

The flexible board 20 may have only one of the folded portions 20a and 20b. This configuration, however, requires only one of the folded portions (e.g., only the first folded portion 20a) to deal with all the extra length of the flexible board 20 (21, 22). This doubles the stroke S in FIG. 7, and makes it more difficult to keep the space for movement. This configuration requires the flexible board 20 (21, 22) to be able to move smoothly relative to the hinge device 14. In other words, this configuration requires not to fix the hinge fixing portion 20c to the hinge device 14. Note here that, as illustrated in FIGS. 4 and 5A, the hinge device 14 is housed in the thin chassis 12A and 12B in Z direction. This means that this configuration requires the flexible board 20 (21, 22) to slide without being caught by the hinge device 14, which may make the manufacturing and design complicated.

In contrast, the configuration including the left and right folded portions 20a and 20b halves the stroke S of each folded portion 20a and 20b, and also makes it easy to keep the moving space for the folded portions 20a and 20b. The manufacturing and designing also are easy without considering the concern that the flexible board 20 (21, 22) may get caught on the hinge device 14.

In particular, the electronic apparatus 10 includes the folded portions 20a and 20b to deal with the extra length, which are located between the hinge fixing portion 20c and the chassis fixing portions 20d and 20e. This controls the motion of the folded portions 20a and 20b even smoother to deal with the extra length, and keeps better reproducibility of the shape of the extra length 38. Although the hinge fixing portion 20c and the chassis fixing portions 20d, 20e may be omitted, the configuration with at least one of them will improve the stability to deal with the extra length.

The folded portions 20a, 20b are folded from top to bottom. This enables smooth folding of the flexible board 20 (21, 22) extending from the hinge device 14 at the folded portions 20a and 20b, and easily achieves thinner chassis. The motherboard 17 and the battery device 18, to which the flexible boards 20 (21, 22) are connected, are under the plates 24A, 24B. Therefore, it is easier to connect to the motherboard 17 and other devices by folding the folded portions 20a and 20b from top to bottom. The folded portions 20a and 20b may be folded from bottom to top.

Figure 8:
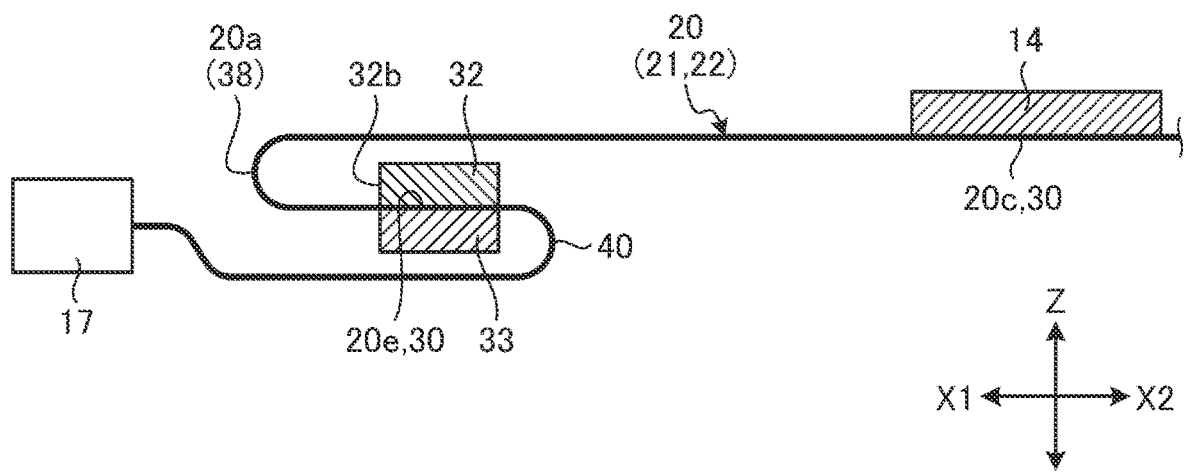
FIG. 8 is a schematic side view of a first folded portion and its periphery in a flexible board.

FIG. 8 is a schematic side view of a first folded portion 20a and its periphery in a flexible board 20 (21, 22) according to a modified example. The configuration of FIG. 8 may be reversed to the left and right to be applied to the second folded portion 20b and its periphery.

The flexible board 20 (21, 22) of FIG. 8 includes a third folded portion 40 instead of the first bending portion 20f between the first folded portion 20a and the motherboard 17. The third folded portion 40 is a portion for turning the flexible board 20 (21, 22) again toward the motherboard 17 after the flexible board 20 (21, 22) is folded at the first folded portion 20a in the opposite direction of the motherboard 17. The third folded portion 40 is located immediately after the first-chassis fixing portion 20d, and is folded from top to bottom and from X2 direction to X1 direction.

The third folded portion 40 has an advantage of reducing the occupied space of the flexible board 20 (21, 22) in Y direction as compared with the configuration including the first bending portion 20f. Note that thinner chassis 12A, 12B are demanded often for the apparatus like the electronic apparatus 10 of the present embodiment. Considering this, the configuration including the first bending portion 20f is more advantageous than the configuration including the third folded portion 40 in terms of thinning because the latter requires more space to be occupied in the thickness direction (Z direction).

The present disclosure is not limited to the above-described embodiments, and can be modified freely without deviating from the scope of the present disclosure.

The above describes the electronic apparatus 10 that is foldable into half like a book as an example. Other than the configuration of folding the chassis of the same shape double, the present disclosure is applicable to various configurations including: a double door configuration in which small chassis are foldably connected to the left and right edges of a large chassis; an S-shaped folding configuration in which chassis with different folding directions are connected to the left and right edges of a single chassis; and a J-shaped folding configuration in which a small chassis is foldably connected to one of the left and right edges of a large chassis. The number of connected chassis may be four or more.

The invention claimed is:

1. An electronic apparatus comprising:
a first chassis that accommodates a first electronic component;
a second chassis adjacent to the first chassis, wherein the second chassis accommodates a second electronic component;
a hinge that connects the first chassis and the second chassis in a relatively rotatable manner between a first posture where the first chassis and the second chassis are stacked to be overlaid in their surface normal directions and a second posture where the first chassis and the second chassis are placed side by side in the direction perpendicular to the surface normal directions;
a flexible board extending over the first chassis and the second chassis to be located across adjacent ends of the first chassis and the second chassis, wherein
the flexible board connects the first electronic component and the second electronic component,
the flexible board includes a first folded portion that is offset from the adjacent ends in a direction toward the first chassis, and
the first folded portion is folded from a first direction, which is directed from the second chassis to the first chassis, to a second direction that is opposite to the first direction; and
a display that extends over the first chassis and the second chassis, and has a bending region that is bent together with a relative rotation between the first chassis and the second chassis, wherein
the first folded portion is folded from the first direction to the second direction while gradually separating away from a rear face of the display, and
the second folded portion is folded from the second direction to the first direction while gradually separating away from the rear face of the display.

2. The electronic apparatus according to claim 1, wherein the flexible board further includes a second folded portion that is offset from the adjacent ends in the direction toward the second chassis, and
the second folded portion is folded from the second direction to the first direction.

3. The electronic apparatus according to claim 2, wherein the flexible board further includes a hinge fixing portion located between the first folded portion and the second folded portion, and
the hinge fixing portion is relatively fixed to the hinge.

4. The electronic apparatus according to claim 2, wherein the flexible board further includes:
a first-chassis fixing portion following the first folded portion folded to the second direction, wherein the first-chassis fixing portion is relatively fixed to the first chassis; and
a second-chassis fixing portion following the second folded portion folded to the first direction, wherein the second-chassis fixing portion is relatively fixed to the second chassis.

5. The electronic apparatus according to claim 2, wherein the flexible board further includes:
a first bending portion bending, following the first folded portion folded to the second direction, to extend along the adjacent ends; and
a second bending portion bending, following the second folded portion folded to the first direction, to extend along the adjacent ends.

6. An electronic apparatus comprising:
a first chassis that accommodates a first electronic component;
a second chassis adjacent to the first chassis, wherein the second chassis accommodates a second electronic component;
a hinge that connects the first chassis and the second chassis in a relatively rotatable manner between a first posture where the first chassis and the second chassis are stacked to be overlaid in their surface normal directions and a second posture where the first chassis and the second chassis are placed side by side in the direction perpendicular to the surface normal directions;

a flexible board extending over the first chassis and the second chassis to be located across adjacent ends of the first chassis and the second chassis, wherein
the flexible board connects the first electronic component and the second electronic component,
the flexible board includes:
a first folded portion that is offset from the adjacent ends in the direction toward the first chassis, wherein the first folded portion is folded from a first direction, which is directed from the second chassis to the first chassis, to a second direction that is opposite to the first direction; and
a chassis fixing portion following the first folded portion folded to the second direction, wherein a first chassis fixing portion is relatively fixed to the first chassis; and a display that extends over the first chassis and the second chassis, and has a bending region that is bent together with a relative rotation between the first chassis and the second chassis, wherein
the first folded portion is folded from the first direction to the second direction while gradually separating away from a rear face of the display, and
the second folded portion is folded from the second direction to the first direction while gradually separating away from the rear face of the display.

7. The electronic apparatus according to claim 6, wherein the flexible board further includes a hinge fixing portion that is relatively fixed to the hinge, and
the first folded portion is located between the hinge fixing portion and the chassis fixing portion.

8. The electronic apparatus according to claim 6, wherein the flexible board further includes a bending portion bending, following the first folded portion folded to the second direction, to extend along the adjacent ends.

9. The electronic apparatus according to claim 6, wherein the flexible board further includes a second folded portion that is offset from the adjacent ends in the direction toward the second chassis, wherein the second folded portion is folded from the second direction to the first direction.

* * * * *